(12) United States Patent
Usta et al.

(10) Patent No.: US 9,312,501 B2
(45) Date of Patent: Apr. 12, 2016

(54) SEMICONDUCTING COMPOUNDS AND OPTOELECTRONIC DEVICES INCORPORATING SAME

(71) Applicant: Polyera Corporation, Skokie, IL (US)

(72) Inventors: Hakan Usta, Evanston, IL (US); Mitchell Denti, Chicago, IL (US); William Christopher Sheets, Chicago, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 478 days.

(21) Appl. No.: 13/843,633

(22) Filed: Mar. 15, 2013

(65) Prior Publication Data

US 2014/0091283 A1 Apr. 3, 2014

Related U.S. Application Data

(60) Provisional application No. 61/707,816, filed on Sep. 28, 2012.

(51) Int. Cl.
*H01L 51/00* (2006.01)
*C09K 11/06* (2006.01)
*H01B 1/12* (2006.01)
*H05B 33/10* (2006.01)

(52) U.S. Cl.
CPC ............ *H01L 51/0074* (2013.01); *C09K 11/06* (2013.01); *H01B 1/12* (2013.01); *H01L 51/0068* (2013.01); *H05B 33/10* (2013.01); *C09K 2211/1007* (2013.01); *C09K 2211/1011* (2013.01); *C09K 2211/1092* (2013.01)

(58) Field of Classification Search
None
See application file for complete search history.

(56) References Cited

U.S. PATENT DOCUMENTS

| 6,537,687 | B1 * | 3/2003 | Nii .................................. 428/690 |
| 2010/0221646 | A1 * | 9/2010 | Kawamonzen et al. ........... 430/2 |
| 2013/0037789 | A1 * | 2/2013 | Yamada et al. ................... 257/40 |

FOREIGN PATENT DOCUMENTS

| EP | 0 183 439 | A2 | 6/1986 | |
| GB | 1071346 | A * | 5/1974 | ............. C07D 85/48 |
| JP | 06186703 | A * | 7/1994 | ............... G03C 7/34 |
| JP | 2009-141338 | A | 6/2009 | |
| JP | 2010-053094 | A | 3/2010 | |

OTHER PUBLICATIONS

Tedjamulia et al., "The synthesis of dinaphthothiophenes," *Journal of Heterocyclic Chemistry*, 20(5):1143-1148, 1983.
Mamada et al., "High performance organic field-effect transistors based on [2,2']bi[naphtho[2,3-b]thiophenyl] with a simple structure," *Journal of Materials Chemistry*, 18(29):3442, 2008.

* cited by examiner

*Primary Examiner* — Robert S Loewe
(74) *Attorney, Agent, or Firm* — Karen K. Chan

(57) ABSTRACT

Disclosed are new compounds having semiconducting properties. Such compounds can be processed in solution-phase into thin film semiconductors that exhibit high carrier mobility and/or good current modulation characteristics.

20 Claims, 3 Drawing Sheets

SEMICONDUCTING COMPOUNDS AND OPTOELECTRONIC DEVICES INCORPORATING SAME

CROSS-REFERENCE TO RELATED APPLICATIONS

This application claims priority to and the benefit of U.S. Provisional Patent Application Ser. No. 61/707,816, filed on Sep. 28, 2012, the disclosure of which is incorporated by reference herein in its entirety.

BACKGROUND

Organic optoelectronic devices such as organic thin film transistors (OTFTs), organic light emitting diodes (OLEDs), organic light emitting transistors (OLETs), printable circuits, organic photovoltaic devices, capacitors and sensors are fabricated using small molecule or polymeric semiconductors as their active components. To achieve high-speed performance and efficient operation, it is desirable that both the p-type and n-type semiconductor materials in these organic semiconductor-based devices exhibit high charge carrier mobility ($\mu$) and stability under ambient conditions, and can be processed in a cost-effective manner.

Accordingly, the art continues to desire new organic semiconductors, particularly those having good stability, processing properties, and/or charge transport characteristics in ambient conditions.

SUMMARY

In light of the foregoing, the present teachings relate to new semiconducting compounds that can exhibit properties such as good charge transport characteristics under ambient conditions, chemical stability, low-temperature processability, stability upon sublimation, possibly solubility in common solvents, and processing versatility. As a result, semiconductor devices such as thin film transistors and light emitting transistors that incorporate the present compounds as the semiconductor layer can have high performance under ambient conditions, for example, demonstrating large charge carrier mobilities, low threshold voltages, and/or high current on-off ratios. Furthermore, these semiconductors may exhibit simultaneously both excellent charge transport capabilities and high fluorescence yields.

In various embodiments, the present teachings provide compounds of formula I:

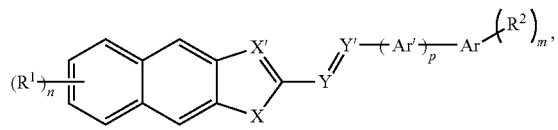

(I)

wherein Ar, Ar', $R^1$, $R^2$, X, X', Y, Y', m, n and p are as defined herein.

The present teachings also provide methods of preparing semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
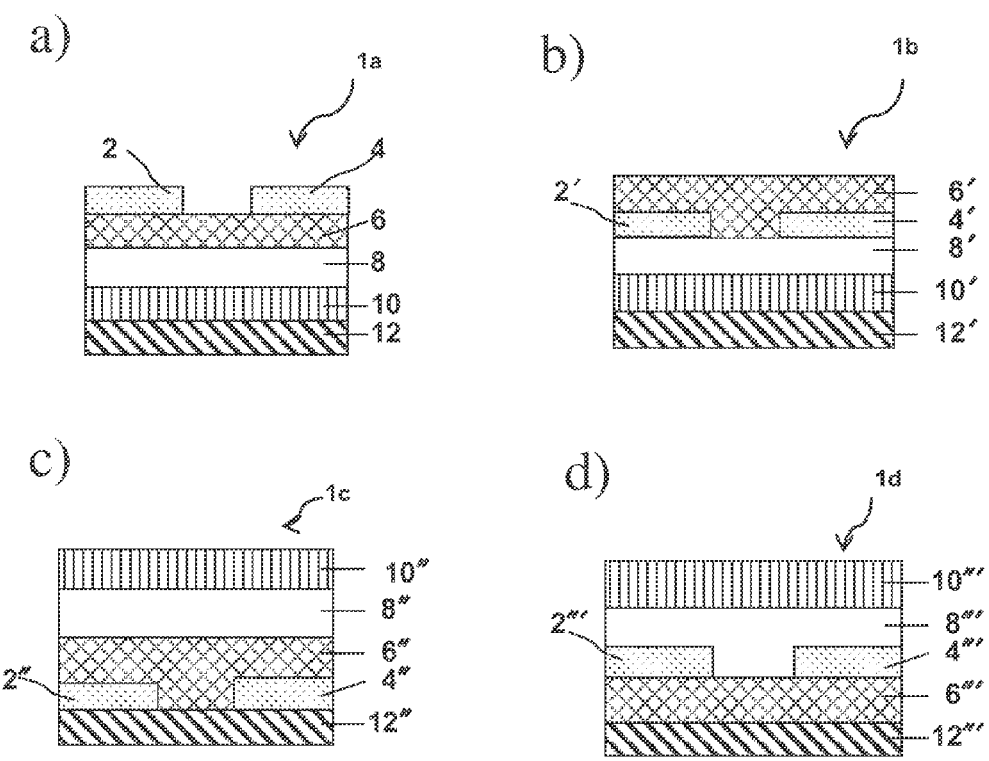
FIG. 1 illustrates four different configurations of thin film transistors: bottom-gate top contact (a), bottom-gate bottom-contact (b), top-gate bottom-contact (c), and top-gate top-contact (d); each of which can be used to incorporate compounds of the present teachings.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group).

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group).

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group).

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

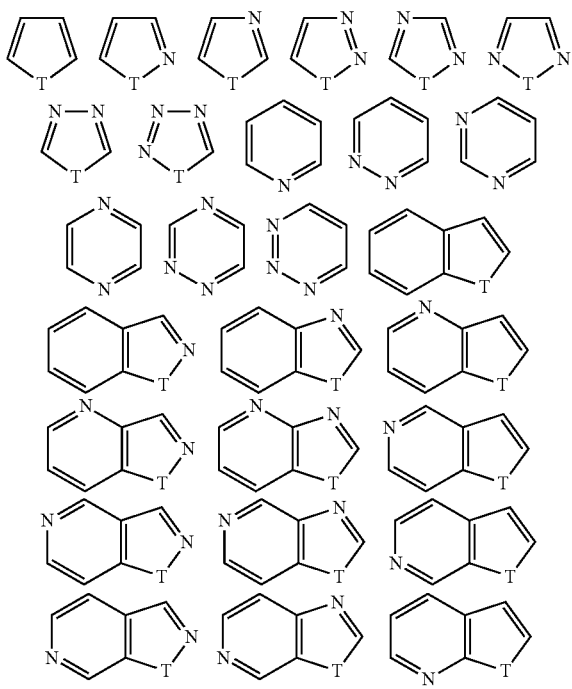

-continued

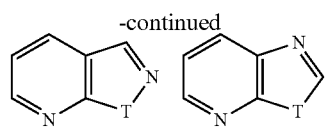

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography.

As used herein, a "p-type semiconductor material," "p-type semiconductor" or a "p-type OSC" refers to a semiconductor material or a semiconducting compound having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10. In certain embodiments, a p-type OSC can be characterized by a highest occupied molecular orbital (HOMO) energy that is higher than or about −6.4 V, preferably higher than or about −6.2 V, and more preferably, higher than or about −6.0 V.

As used herein, an "n-type semiconductor material," an "n-type semiconductor" or an "n-type OSC" refers to a semiconductor material or a semiconducting compound having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10. In certain embodiments, an n-type OSC can be characterized by a lowest unoccupied molecular orbital (LUMO) energy that is lower than or about −3.2 V, preferably lower than or about −3.6 V, and more preferably, lower than or about −4.0 V.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which limited depends on the device architecture, can be measured using a field-effect device or space-charge current measurements.

As used herein, a component (such as a thin film layer) can be considered "photoactive" if it contains one or more compounds that can absorb photons to produce excitons for the generation of a photocurrent or generate light upon acting as a recombination site for electrons and holes.

As used herein, "solution-processable" refers to compounds, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

As used herein, "vapor phase-processable" refers to compounds, materials, or compositions that can be used in various vapor-phase deposition methods such as sublimation, physical vapor deposition, sputtering, thermal evaporation, and inert gas transport evaporation.

Throughout the specification, structures may or may not be presented with chemical names. Where any question arises as to nomenclature, the structure prevails.

The present teachings provide various semiconducting small molecule compounds (small molecule semiconductors) as well as compositions and organic semiconductor materials prepared from such compounds and compositions. The organic semiconductor materials disclosed herein can exhibit useful electrical properties and can be solution- or vapor phase-processable, e.g., spin-coatable, printable, or deposited upon thermal evaporation under vacuum. The semiconductor materials disclosed herein can be used to fabricate various organic electronic articles, structures and devices, including field-effect transistors, light emitting transistors, unipolar circuitries, complementary circuitries, and photovoltaic devices.

More specifically, the present teachings relate to compounds having formula I:

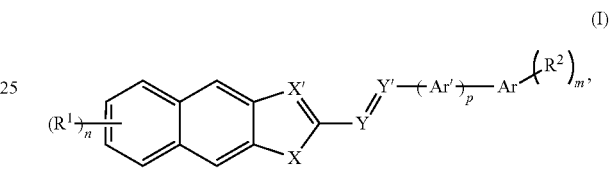

wherein:

Ar can be an optionally substituted $C_{6-20}$ aryl group or an optionally substituted 5-20 membered heteroaryl group;

Ar' can be an optionally substituted $C_{6-20}$ aryl group or an optionally substituted 5-20 membered heteroaryl group;

$R^1$ and $R^2$, at each occurrence, independently can be selected from the group consisting of a halogen, —CN, and -L-R, wherein L, at each occurrence, is selected from —O—, —S—, —Se—, —C(O)—, —OC(O)—, —C(O)O—, and a covalent bond; and R, at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group;

X can be selected from the group consisting of —O—, —S—, and —Se—;

X' can be —CR$^3$= or —N=, wherein R$^3$ is selected from the group consisting of H, a halogen, —CN, and -L'-R', wherein L' is selected from the group consisting of —O—, —S—, —Se—, —C(O)—, —OC(O)—, —C(O)O—, and a covalent bond; and R' is selected from the group consisting of a $C_{1-40}$ alkyl group, a $C_{2-40}$ alkenyl group, a $C_{2-40}$ alkynyl group, and a $C_{1-40}$ haloalkyl group;

Y and Y', independently, can be CH or N;

m can be 0, 1, 2, 3, 4 or 5;

n can be 0, 1, 2, 3 or 4; and p can be 0 or 1.

In preferred embodiments, X can be —S— and X' can be —CH=. Accordingly, certain embodiments of the compounds according to the present teachings can be represented by formula II:

(II)

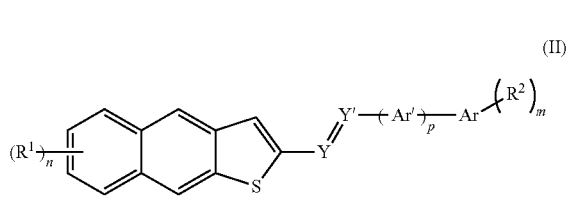

wherein Ar, Ar', $R^1$, $R^2$, Y, Y', m, n and p are as defined herein.

In particular embodiments, both Y and Y' can be CH; while n can be 0. Accordingly, certain embodiments of the compounds according to the present teachings can be represented by formula III:

(III)

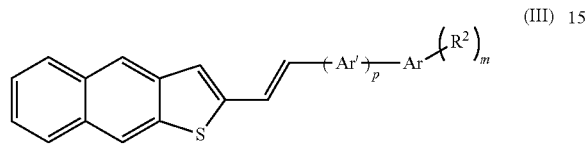

wherein Ar, Ar', $R^2$, m and p are as defined herein.

In various embodiments, Ar and Ar' independently can be selected from the group consisting of a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group, a benzothienyl group, a naphthyl group, a thienothienyl group, a naphthothienyl group, and quinolyl group, each of which optionally can be substituted with 1-5 groups independently selected from the group consisting of a halogen, —CN, and -L'-R', wherein L' and R' are as defined herein. In certain embodiments, Ar', if present (i.e., p=1), can be an optionally substituted phenyl group or an optionally substituted monocyclic 5- or 6-membered heteroaryl group. For example, Ar', if present (i.e., p=1), can be a phenyl group or a thienyl group, either of which can be optionally substituted as described herein. In particular embodiments, both Ar and Ar' can be a phenyl group. In other embodiments, both Ar and Ar' can be a thienyl group. In yet other embodiments, one of Ar and Ar' can be a phenyl group, while the other of Ar and Ar' can be a thienyl group.

In some embodiments, Ar can be a bicyclic or tricyclic moiety comprising at least one 5-membered heteroaryl group. Accordingly, in some embodiments where p is 0, the present compounds can be represented by formula IV:

(IV)

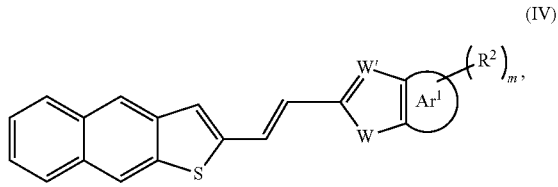

wherein:
$Ar^1$ can be an optionally substituted $C_{6-14}$ aryl group or an optionally substituted 5-14 membered heteroaryl group;
W can be selected from the group consisting of —$CR^3$=$CR^3$—, —O—, —S—, and —Se—;
W' can be —$CR^3$= or —N=, wherein $R^3$ can be selected from the group consisting of H, a halogen, —CN, and -L'-R', wherein L' can be selected from the group consisting of —O—, —S—, —Se—, —C(O)—, —OC(O)—, —C(O)O—, and a covalent bond; and R' can be selected from the group consisting of a $C_{1-40}$ alkyl group, a $C_{2-40}$ alkenyl group, a $C_{2-40}$ alkynyl group, and a $C_{1-40}$ haloalkyl group; and $R^2$ and m are as defined herein.

In particular embodiments, Ar can be a bicyclic or tricyclic moiety comprising at least one thienyl group. Accordingly, in particular embodiments, the present compounds can be represented by formula V:

(V)

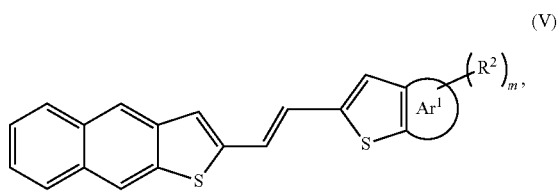

wherein $Ar^1$ can be an optionally substituted $C_{6-14}$ aryl group or an optionally substituted 5-14 membered heteroaryl group; and $R^2$, and m are as defined herein. For example, $R^2$ can be a $C_{1-40}$ alkyl group or a $C_{1-40}$ haloalkyl group; and m can be 0, 1 or 2

To further illustrate, the moiety

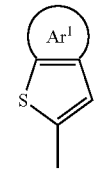

can be selected from the group consisting of:

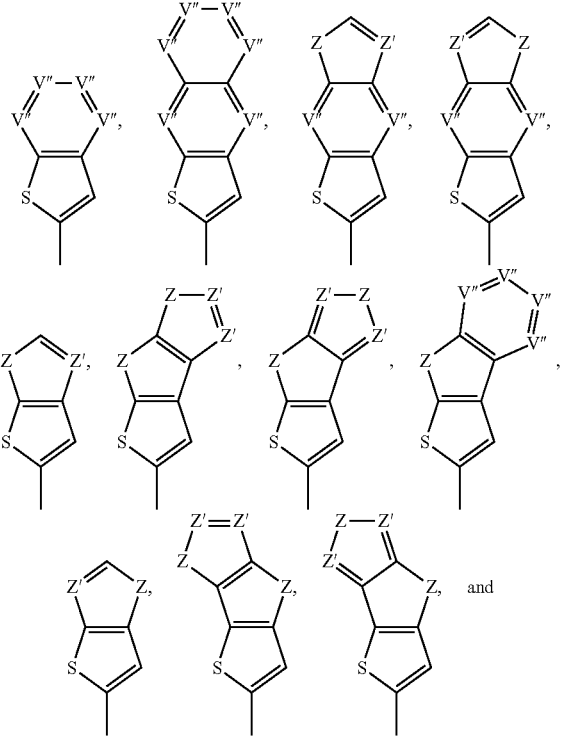

-continued

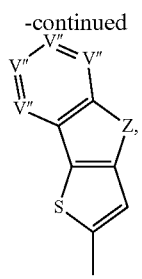

wherein:
V″, at each occurrence, independently can be —CR⁴= or —N=;
Z, at each occurrence, independently can be selected from the group consisting of —O—, —S—, and —Se—;
Z′, at each occurrence, independently can be —CR⁴= or —N=; and
R⁴, at each occurrence, independently can be selected from the group consisting of H, a halogen, —CN, and L'R', wherein L', at each occurrence, is selected from the group consisting of —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group. For example, the moiety

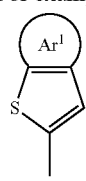

can be selected from the group consisting of:

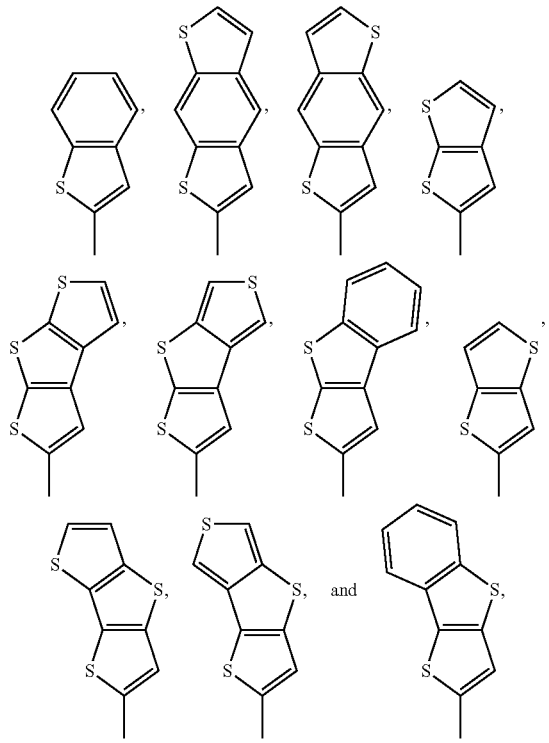

wherein any of the carbon atoms optionally can be substituted with a halogen, —CN, or -L'-R', wherein L', at each occurrence, can be selected from the group consisting of —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group.

Exemplary compounds according to the present teachings can include

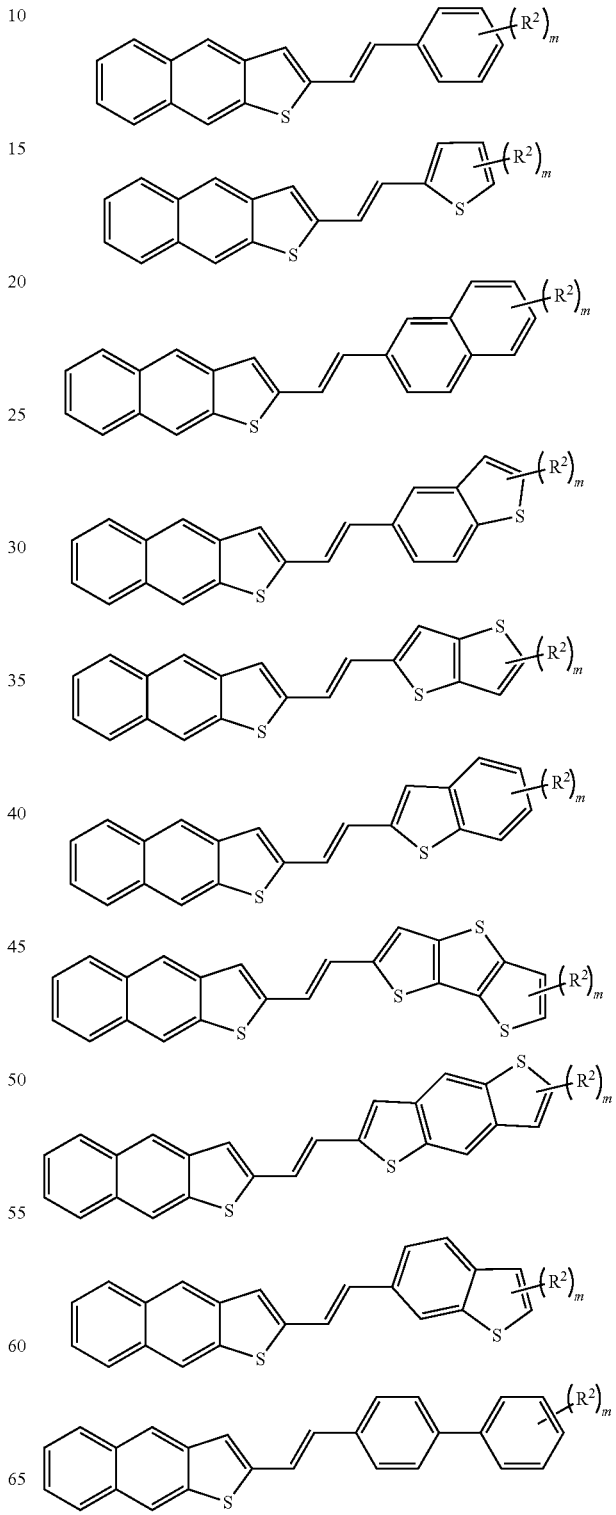

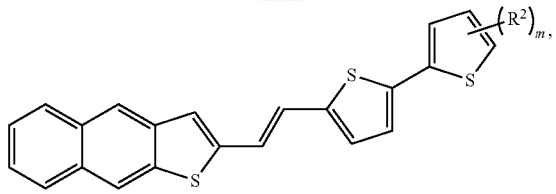

wherein R² and m are as defined herein. For example, R² can be a $C_{1-40}$ alkyl group or a $C_{1-40}$ haloalkyl group; and m can be 0, 1 or 2.

Compounds of the present teachings can be prepared according to procedures described in Example 1. Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the polymers described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Various compounds according to the present teachings can have good charge transport properties and can be stable under ambient conditions ("ambient stable"), soluble in common solvents, and in turn solution-processable into various articles, structures, or devices.

Accordingly, the present teachings provide organic semiconductor devices that include one or more compounds described herein as semiconductors. Examples of such organic semiconductor devices include various electronic devices, optical devices, and optoelectronic devices such as thin film transistors (e.g., field effect transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, ring oscillators, integrated circuits (ICs), radiofrequency identification (RFID) tags, electroluminescent displays, and organic memory devices. In some embodiments, the present teachings provide for a semiconductor component including one or more compounds described herein, and a thin film transistor device including the semiconductor component. In particular, the thin film transistor device can have a structure selected from top-gate bottom-contact structure, bottom-gate top-contact structure, top-gate top-contact structure, and bottom-gate bottom-contact structure. The thin film transistor device can include a dielectric material, wherein the dielectric material can be an organic dielectric material, an inorganic dielectric material, or a hybrid organic/inorganic dielectric material. In other embodiments, the present teachings provide for photovoltaic devices and organic light emitting devices incorporating a semiconductor component that is photoactive and includes one or more compounds described herein.

As described above, compounds of the present teachings can have good solubility in a variety of common solvents. Thus, various embodiments of the present compounds can be processed via inexpensive solution-phase techniques into electronic devices, optical devices, or optoelectronic devices. As used herein, a compound can be considered soluble in a solvent when at least 1 mg of the compound can be dissolved in 1 mL of the solvent. Examples of common non-chlorinated organic solvents include petroleum ethers; acetonitrile; aromatic hydrocarbons such as benzene, toluene, xylene, and mesitylene; ketones such as acetone and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; acetates such as methyl acetate, ethyl acetate, methyl formate, ethyl formate, isopropyl acetate, and butyl acetate; amides such as dimethylformamide and dimethylacetamide; sulfoxides such as dimethylsulfoxide; and cyclic solvents such as cyclopentanone, cyclohexanone, and 2-methypyrrolidone.

Accordingly, the present teachings further provide compositions that include one or more compounds disclosed herein dissolved or dispersed in a fluid medium, for example, an organic solvent. In some embodiments, the composition can further include one or more additives independently selected from detergents, dispersants, binding agents, compatibilizing agents, curing agents, initiators, humectants, antifoaming agents, wetting agents, pH modifiers, biocides, and bacteriostats. For example, surfactants and/or other polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent.

Various deposition techniques, including various solution-processing techniques, have been used with organic electronics. For example, much of the printed electronics technology has focused on inkjet printing, primarily because this technique offers greater control over feature position and multilayer registration. Inkjet printing is a noncontact process, which offers the benefits of not requiring a preformed master (compared to contact printing techniques), as well as digital control of ink ejection, thereby providing drop-on-demand printing. However, contact printing techniques have the key advantage of being well-suited for very fast roll-to-roll processing. Exemplary contact printing techniques include screen-printing, gravure, offset, flexo, and microcontact printing. Other solution processing techniques include, for example, spin coating, drop-casting, zone casting, dip coating, and blade coating.

The present compounds can exhibit versatility in their processing. Formulations including the present compounds can be printable via different types of printing techniques including gravure printing, flexographic printing, and inkjet printing, providing smooth and uniform films that allow, for example, the formation of a pinhole-free dielectric film thereon, and consequently, the fabrication of all-printed devices.

The present teachings, therefore, further provide methods of preparing a semiconductor material. The methods can include preparing a composition that includes one or more compounds disclosed herein dissolved or dispersed in a fluid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes one or more compounds disclosed herein. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying. In various embodiments, the depositing step can be carried out at low temperatures, for example, a temperature less than about 50° C., less than about 40° C., or about room temperature. More expensive processes such as vapor deposition also can be used.

The present teachings further provide articles of manufacture, for example, composites that include a semiconductor component (e.g., a thin film semiconductor) of the present teachings in contact with a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., as described in U.S. Pat. No. 7,678,463, the entire disclosure of which is incorporated by reference herein). In some embodiments, the dielectric component can include the crosslinked polymer blends described in U.S. Pat. No. 7,605,394, the entire disclosure of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs) and organic light-emitting transistors (OLETs), as well as sensors, capacitors, unipolar circuits, complementary circuits (e.g., inverter circuits), and the like.

Accordingly, an aspect of the present teachings relates to methods of fabricating an organic thin film transistor that incorporates a semiconductor component of the present teachings. The semiconductor components of the present teachings can be used to fabricate various types of organic thin film transistors including top-gate top-contact field-effect transistors, top-gate bottom-contact field-effect transistors, bottom-gate top-contact field-effect transistors, and bottom-gate bottom-contact field-effect transistors.

FIG. 1 illustrates the four common types of OFET structures: (a) bottom-gate top-contact structure, (b) bottom-gate bottom-contact structure, (c) top-gate bottom-contact structure, and (d) top-gate top-contact structure. As shown, in each of the configurations, the semiconductor component is in contact with the source and drain electrodes, and the gate dielectric component is in contact with the semiconductor component on one side and the gate electrode on an opposite side. Optional layers (not shown) can be present, including a surface-modifying layer on the substrate, a passivation on the semiconductor layer, charge injection layers adjacent to the source and drain electrodes, an encapsulation layer over the device as a whole, and/or other interfacial layers.

In certain embodiments, OTFT devices can be fabricated with one or more compounds disclosed herein on doped silicon substrates, using $SiO_2$ as the dielectric, in top-contact geometries. In particular embodiments, the active semiconductor layer which incorporates one or more compounds disclosed herein can be deposited at room temperature or at an elevated temperature. In other embodiments, the active semiconductor layer which incorporates one or more compounds disclosed herein can be applied by spin-coating or printing, using a composition including one or more of the present compounds dissolved or otherwise mobilized in a fluid medium and optionally with one or more additives (e.g., a polymer to enhance processing). Accordingly, in some embodiments, the present compounds can be present in a blend material in the resulting semiconductor component. For top-contact devices, metallic contacts can be patterned on top of the films using shadow masks.

In certain embodiments, OTFT devices can be fabricated with one or more compounds disclosed herein on plastic foils, using polymers as the dielectric, in top-gate bottom-contact geometries. In particular embodiments, the active semiconducting layer which incorporates one or more compounds disclosed herein can be deposited at room temperature or at an elevated temperature. In other embodiments, the active semiconducting layer which incorporates one or more compounds disclosed herein can be applied by spin-coating or printing, using a composition including one or more of the present compounds dissolved or otherwise mobilized in a fluid medium and optionally with one or more additives (e.g., a polymer to enhance processing). Accordingly, in some embodiments, the present compounds can be present in a blend material in the resulting semiconductor component. Gate and source/drain contacts can be made of Au, other metals, or conducting polymers and deposited by vapor-deposition and/or printing.

In various embodiments, a semiconductor component incorporating one or more compounds disclosed herein can exhibit p-type semiconducting activity (i.e., the present compound can function as a hole-conducting compound), for example, having a hole mobility of $10^{-5}$ cm$^2$/V-sec or greater and/or a current on/off ratio ($I_{on}/I_{off}$) of $10^3$ or greater.

In other embodiments, a semiconductor component incorporating one or more compounds disclosed herein can exhibit n-type semiconducting activity (i.e., the present compound can function as an electron-conducting compound), for example, having a hole mobility of $10^{-5}$ cm$^2$/V-sec or greater and/or a current on/off ratio ($I_{on}/I_{off}$) of $10^3$ or greater.

In certain embodiments, the present compounds can have light-emitting properties (e.g., via fluorescence). As such, a semiconductor component incorporating one or more compounds disclosed herein can be photoactive. A photoactive semiconductor component according to the present teachings can be used in an organic light-emitting transistor device, which can include components (dielectric and source, drain and gate electrodes) and architecture similar to those described for organic thin film transistors (see e.g., FIG. 1). The photoactive semiconductor component can include the present compounds, optionally together with one or more semiconducting compounds (e.g., compounds that conduct charge carriers of a type opposite to those conducted by the present compounds), guest emitters, and/or host materials. In some embodiments, the photoactive semiconductor component can be deposited as one thin film where the various compounds can be present in a blend material. In other embodiments, the semiconductor component can be a laminate of multiple layers, where each layer can perform a different function. For example, the laminate can include one or more charge transport layers and one or more light-emitting layers. In certain embodiments, the present compounds can be present in a charge transport layer within the multilayer semiconductor component in such a light-emitting transistor. In other embodiments, the present compounds can be present in a light-emitting layer within the multilayer semiconductor component.

A plurality of OFETs or OLETs according to the present teachings can be arranged in a matrix to provide a display device. The display device can include optional driving and switching elements, compensating transistor elements, capacitors, and/or light-emitting diodes.

Other articles of manufacture in which one or more compounds disclosed herein can be useful include photovoltaics or solar cells. The present compounds can exhibit broad optical absorption and/or a tuned redox properties and bulk carrier mobilities. Accordingly, the present compounds can be used, for example, as a p-type semiconductor in a photovoltaic design, which includes an adjacent n-type semiconductor to form a p-n junction. The present compounds can be in the form of a thin film semiconductor, or a composite including the thin film semiconductor deposited on a substrate.

The following examples are provided to illustrate further and to facilitate the understanding of the present teachings and are not in any way intended to limit the invention.

Unless otherwise noted, all reagents were purchased from commercial sources and used without further purification. Some reagents were synthesized according to known procedures. Anhydrous tetrahydrofuran (THF) was distilled from sodium/benzophenone. Reactions were carried out under nitrogen unless otherwise noted. UV-Vis spectra were recorded on a Cary Model 1 UV-vis spectrophotometer. NMR spectra were recorded on a Varian Unity Plus 500 spectrometer ($^1$H, 500 MHz; $^{13}$C, 125 MHz). Electrospray mass spectrometry was performed on a Thermo Finnegan model LCQ Advantage mass spectrometer.

Example 1

Synthesis of Representative Compounds

Example 1a

Synthesis of 1MP-PVNT and H-PVNT

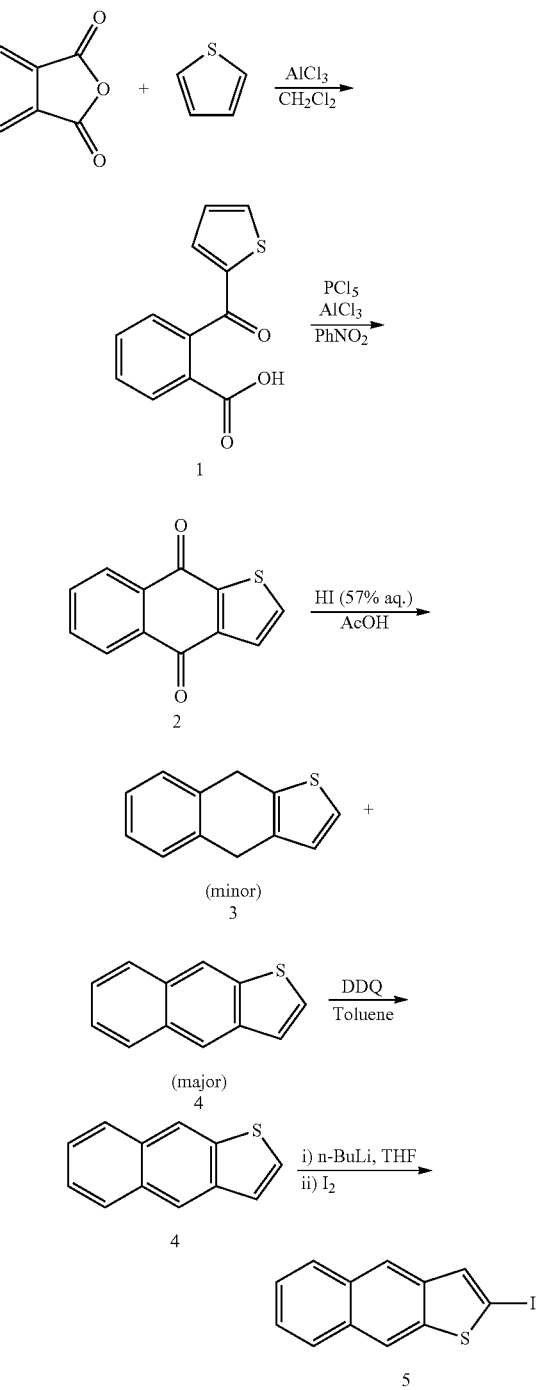

Scheme 1.

-continued

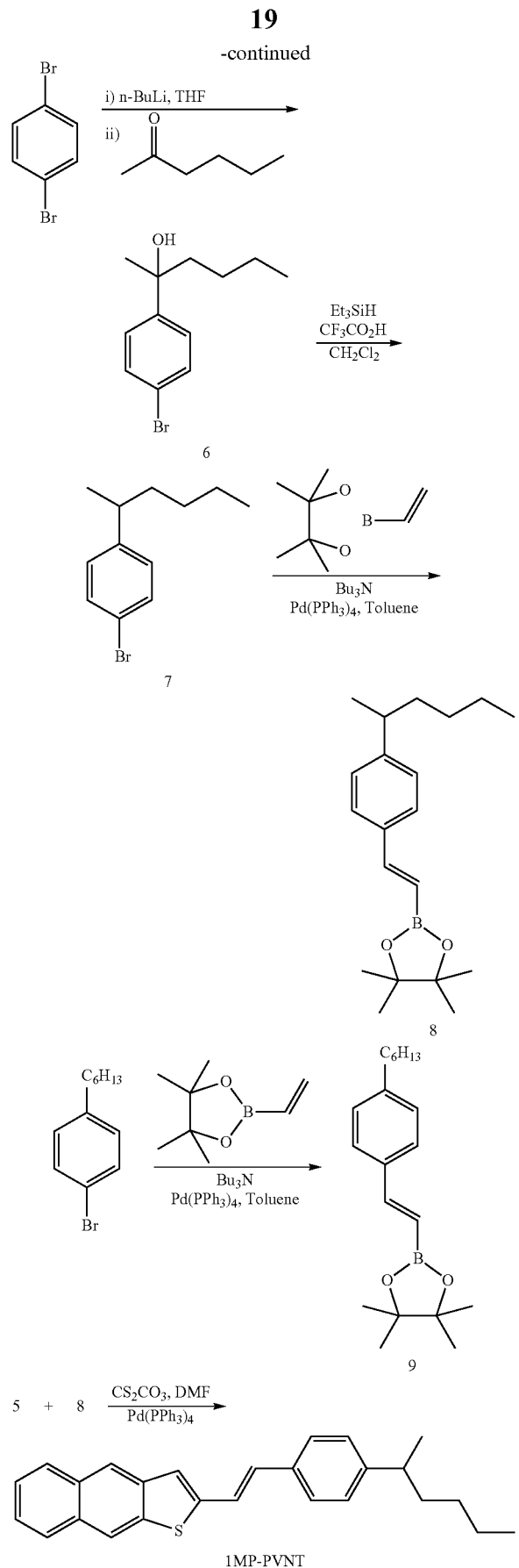

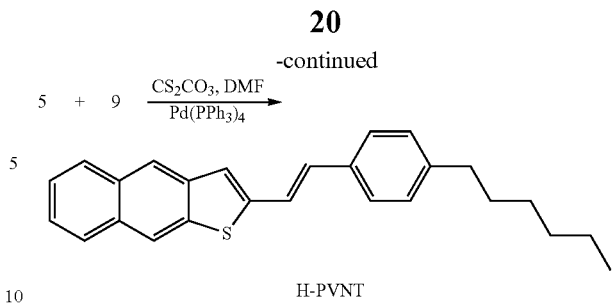

-continued

H-PVNT

The procedures described in Scheme 1 above can be used to prepare various compounds according to the present teachings, for example, by coupling 5 with various (halo)alkyl-substituted bromo-(hetero)aryl group. To illustrate, the syntheses of 2-[2-(4-(1-methylpentyl)phenyl)vinyl]naphtho[2,3-b]thiophene (1MP-PVNT) and 2-[2-(4-(n-hexyl)phenyl)vinyl]naphtho[2,3-b]thiophene (H-PVNT) are described.

2-(Thiophene-2-carbonyl)benzoic acid (1)

Aluminum chloride (58.7 g, 440 mmol, 2.2 equiv.) and dichloromethane (150 mL) were added to a round bottom flask. A solution of phthalic anhydride (29.6 g, 200 mmol, 1.0 equiv.) in dichloromethane (150 mL) was then added, and the mixture was stirred at room temperature for 30 minutes. Thiophene (15.8 mL, 200 mL, 1.0 equiv.) was added over 1 hour, after which the reaction mixture was stirred for 3 hours at room temperature. The reaction mixture was cautiously quenched with hydrochloric acid (0.2 M, 1 L), extracted with dichloromethane, and extracted with aqueous NaOH (1 N, 3×200 mL). The aqueous layer was acidified with concentrated hydrochloric acid; the solids were collected by filtration, and stirred in refluxing methanol. The suspension was filtered, and water was added to the filtrate to crystallize 1 as a colorless solid (20.7 g, 45%). $^1$H NMR (500 MHz, CDCl$_3$) δ8.09 (dd, J=7.8, 0.85 Hz, 1H), 7.70 (dd, J=4.9, 1.1 Hz, 1H), 7.67 (td, J=7.5, 1.3 Hz, 1H), 7.58 (td, J=7.8, 1.3 Hz, 1H), 7.47 (dd, J=7.5, 0.90, 1H), 7.27-7.26 (m, 1H), 7.07-7.06 (m, 1H). m.p 144-145° C.

Naphtho[2,3-b]thiophene-4,9-dione (2)

2-(thiophene-2-carbonyl)benzoic acid (1, 14.0 g, 60.3 mmol, 1.0 equiv.), nitrobenzene (400 mL), and phosphorus pentachloride (18.8 g, 90.4 mmol. 1.5 equiv.) were added to a schlenk flask. Aluminum chloride was then added (12.1 g, 90.4 mmol, 1.5 equiv.), and the reaction was stirred for 1 hour at room temperature followed by 4 hours at 140° C. The solvent was distilled off under vacuum, and the black residue was sonicated in dichloromethane (500 mL) and filtered through CELITE®. The filtrate was concentrated in vacuo and purified by column chromatography (silica gel, dichloromethane:hexanes (1:1)→dichloromethane). The product was further purified by recrystallization from methanol to give 2 as brown needle-shaped crystals (6.45 g, 50%). $^1$H NMR (500 MHz, CDCl$_3$) δ8.26-8.24 (m, 2H), 7.78-7.77 (m, 2H), 7.75-7.71 (m, 2H). m.p. 232-234° C.

Naphtho[2,3-b]thiophene (4)

Naphtho[2,3-b]thiophene-4,9-dione (2, 6.45 g, 30.1 mmol, 1.0 equiv.), glacial acetic acid (1.0 L) and hydroiodic acid (150 mL, 57 wt. % aqueous) were heated under reflux condition for 18 hours. After cooling to room temperature the solution was diluted with aqueous sodium bisulfite and dichloromethane. The organic layer was washed twice with water and once with brine, then dried with magnesium sulfate, and concentrated in vacuo to yield a crude solid. The crude material was loaded onto a silica gel column and eluted with dichloromethane-hexanes (1:1, v/v) to give a mixture of 4,9-dihydronaphtho[2,3-b]thiophene (3) and naphtho[2,3-b]thiophene (4) as a beige solid (2.65 g). The solid thus obtained was combined with toluene (250 mL) and 2,3-dichloro-5,6-dicyano-p-benzoquinone (8.70 g, 15.9 mmol) in a schlenk flask, and stirred for 1 day at room temperature. The mixture was filtered through CELITE® and concentrated in vacuo to give a crude solid. The crude was purified by column chromatography (silica gel, dichloromethane:hexanes (1:3)→dichloromethane) to yield 4 as a white solid (933 mg, 17%). $^1$H NMR (500 MHz, CDCl$_3$) δ 8.29 (s, 1H), 8.26 (s, 1H), 7.94-7.92 (m, 1H), 7.88-7.86 (m, 1H), 7.53 (d, J=5.6 Hz, 1H), 7.49-7.47 (m, 2H), 7.41 (d, J=5.6 Hz, 1H). m.p. 193-194° C.

2-Idonaphtho[2,3-b]thiophene (5)

n-BuLi (2.5 M in hexanes, 1.14 mL, 2.85 mmol) was added dropwise to a solution of naphtho[2,3-b]thiophene (4, 500 mg, 2.71 mmol) in THF (50.0 mL) at −78° C. under nitrogen. The resulting reaction mixture was stirred at −78° C. for 15 minutes and at room temperature for 2 hours. After cooling the mixture to −78° C., I$_2$ (0.79 g, 3.12 mmol) was added as a solid under positive nitrogen flow. The reaction mixture was stirred overnight while allowing to warm to room temperature. Then, the reaction mixture was quenched with water, and the product was extracted with chloroform. Organic phase was washed with water and brine, dried over Na$_2$SO$_4$, and evaporated in vacuo to yield a crude solid. The crude was purified by column chromatography (silica gel, chloroform) to yield 5 as an off-white solid (0.74 g, 88%). $^1$H NMR (500 MHz, CDCl$_3$) δ8.26 (s, 1H), 8.22 (s, 1H), 7.95 (d, J=7.5 Hz, 1H), 7.88 (d, J=7.5 Hz, 1H), 7.65 (s, 1H), 7.49 (m, 2H). m.p. 205-206° C.

1-Bromo-4-(1-hydroxy-1-methylpentyl)benzene (6)

n-BuLi (2.5 M in hexanes, 17.0 mL, 42.5 mmol) was added dropwise to a solution of 1,4-dibromobenzene (10.04 g, 42.5 mmol) in THF (100 mL) at −78° C. under nitrogen. After stirring at −78° C. for 1 hour, 2-hexanone (4.5 g, 44.9 mmol) was added dropwise, and the solution was warmed to room temperature and stirred overnight. The reaction mixture was quenched with water and the organic layer was separated. Next, the organic phase was washed with water, dried over Na$_2$SO$_4$, and concentrated on a rotary evaporator to give a crude oil. The crude was purified by column chromatography (silica gel, chloroform) to give 6 as a colorless oil (10.0 g, 91% yield). $^1$H NMR (500 MHz, CDCl$_3$) δ 7.45 (d, J=8.8 Hz, 2H), 7.30 (d, J=8.8 Hz, 2H), 1.79-1.75 (m, 2H), 1.68 (s, 1H), 1.54 (s, 3H), 1.24-1.28 (m, 4H), 0.85 (t, 3H).

1-Bromo-4-(1-methylpentyl)benzene (7)

To a solution of 1-bromo-4-(1-hydroxy-1-methylpentyl)benzene (6, 2.0 g, 7.78 mmol) in dichloromethane (30 mL) was added triethylsilane (1.40 mL, 8.77 mmol), and the solution was cooled to 0° C. under nitrogen. Then, the solution was treated with trifluoroacetic acid (6.0 mL, 78 mmol) dropwise over 30 min. The solution was warmed to room temperature and stirred for 3 h. The reaction mixture was carefully quenched with NaOH (1M, 90 mL) to give a basic mixture (pH~10), which was next extracted with dichloromethane (100 mL). The organic phase was washed with water, dried over Na$_2$SO$_4$, concentrated on a rotary evaporator to give the crude compound as an oil. The crude product was purified by column chromatography (silica gel, hexanes) to give 7 as a colorless oil (1.70 g, 90% yield). $^1$H NMR (500 MHz, CDCl$_3$) δ 7.40 (d, J=8.5 Hz, 2H), 7.05 (d, J=8.5 Hz, 2H), 2.64 (m, 1H), 1.53 (m, 2H), 1.21 (d, 3H), 1.11-1.30 (m, 4H), 0.84 (t, 3H).

4,4,5,5-Tetramethyl-2-[(1E)-2-(4-(1-methylpentyl)phenylethenyl]-1,3,2-dioxaborolane (8)

1-Bromo-4-(1-methylpentyl)benzene (7, 500 mg, 2.07 mmol), 2-vinyl-4,4,5,5-tetramethyl-1,3,2-dioxaborolane (575 mg, 3.73 mmol), tributylamine (1.0 mL), and Pd(PPh$_3$)$_4$ (60 mg, 0.052 mmol, 2.5% mol) were placed in a schlenk flask. Then, dry toluene (10 mL) was added, and the resulting reaction mixture was de-gassed by three cycles of freeze-pump-thaw. The reaction mixture was heated at 100° C. for 1 day under nitrogen. The reaction mixture was then allowed to cool to room temperature, diluted with dichloromethane, and washed with 10% HCl. The organic phase was separated, washed with brine, dried over Na$_2$SO$_4$, and concentrated in vacuo. The crude was passed through a short column (silica gel, hexane:ethyl acetate, 8:2, v/v) in order to remove polar impurities. The compound 8 was obtained as a colorless oil and used without any further purification (97 mg, 15% yield). $^1$H NMR (500 MHz, CDCl$_3$) δ 7.42 (d, J=8.0 Hz, 2H), 7.40 (d, J=18.5 Hz, 1H), 7.15 (d, J=8.0 Hz, 2H), 6.10 (d, J=18.5 Hz, 1H), 2.65 (m, 1H), 1.71 (m, 2H), 1.37 (d, 3H), 1.11-1.35 (m, 4H), 0.87 (t, 3H).

4,4,5,5-Tetramethyl-2-[(1E)-2-(4-(n-hexyl)phenylethenyl]-1,3,2-dioxaborolane (9)

1-Iodo-4-hexylbenzene (2.15 g, 7.46 mmol), 2-vinyl-4,4,5,5-tetramethyl-1,3,2-dioxaborolane (2.07 g, 13.44 mmol), tributylamine (3.6 mL), and Pd(PPh$_3$)$_4$ (0.22 g, 0.19 mmol, 2.5% mol) were placed in a schlenk flask. Then, dry toluene (25 mL) was added, and the resulting reaction mixture was de-gassed by three cycles of freeze-pump-thaw. The reaction mixture was heated at 100° C. for 1 day under nitrogen. The reaction mixture was then allowed to cool to room temperature, diluted with dichloromethane, and washed with 10% HCl. The organic phase was separated, washed with brine, dried over Na$_2$SO$_4$, and concentrated in vacuo. The crude was purified by column chromatography (silica gel, hexane:ethyl acetate, 9:1, v/v), which yielded 9 as a colorless oil (1.05 g, 45% yield). $^1$H NMR (500 MHz, CDCl$_3$) δ 7.41 (d, J=8.0 Hz, 2H), 7.36 (d, J=18.0 Hz, 1H), 7.14 (d, J=8.0 Hz, 2H), 6.10 (d, J=18.0 Hz, 1H), 2.60 (t, 2H), 1.62 (m, 2H), 1.27-1.35 (m, 6H), 0.88 (t, 3H).

2-[2-(4-(1-methylpentyl)phenyl)vinyl]naphtho[2,3-b]thiophene (1MP-PVNT)

A solution of 4,4,5,5-tetramethyl-2-[(1E)-2-(4-(1-methylpentyl)phenylethenyl]-1,3,2-dioxaborolane (8, 97 mg, 0.31 mmol), 2-iodonaphtho[2,3-b]thiophene (5, 96 mg, 0.31 mmol), Cs$_2$CO$_3$ (1.26 g, 3.86 mmol), and Pd(PPh$_3$)$_4$ (30 mg, 0.026 mmol, 8% mol) in dry DMF (20 mL) was heated at 80° C. for overnight under nitrogen. The reaction mixture was then allowed to cool to room temperature, diluted with chloroform, and washed with water. The organic phase was separated and washed with water and brine, dried over Na$_2$SO$_4$, and concentrated in vacuo to yield a crude solid. The crude was further purified by column chromatography (silica gel, hexanes:chloroform, 4:1, v/v) to yield 1MP-PVNT as an off-white solid (30 mg, 26% yield). $^1$H NMR (500 MHz, CDCl$_3$) δ 8.24 (s, 1H), 8.17 (s, 1H), 7.93 (m, 1H), 7.87 (m, 1H), 7.45

(m, 4H), 7.32 (d, J=16.0 Hz, 1H), 7.31 (s, 1H), 7.20 (d, J=8.0 Hz, 2H), 6.99 (d, J=16 Hz, 1H), 2.72 (m, 1H), 1.63 (m, 2H), 1.27 (d, 3H), 1.11-1.33 (m, 4H), 0.85 (t, 3H). Anal. calcd. for ($C_{26}H_{26}S$): C, 84.27; H, 7.07. Found: C, 84.13; H, 6.96. m.p. 280-282° C.

2-[2-(4-(n-hexyl)phenyl)vinyl]naphtho[2,3-b]thiophene (H-PVNT)

A solution of 4,4,5,5-tetramethyl-2-[(1E)-2-(4-(n-hexyl)phenylethenyl]-1,3,2-dioxaborolane (9, 0.93 g, 2.96 mmol), 2-iodonaphtho[2,3-b]thiophene (5, 500 mg, 1.61 mmol), $Cs_2CO_3$ (3.15 g, 9.66 mmol), and $Pd(PPh_3)_4$ (74.4 mg, 0.064 mmol, 4% mol) in dry DMF (50 mL) was heated at 80° C. for overnight for 2 days. The reaction mixture was then allowed to cool to room temperature, the formed precipitate was filtered and washed with methanol, water, and hexanes to yield a green crude solid. The crude solid was purified by vacuum sublimation in high vacuum ($T_{sub}$=260° C.) to give H-PVNT as an off-white solid (300 mg, 50% yield). $^1$H NMR (500 MHz, $C_2D_2Cl_4$) δ 8.26 (s, 1H), 8.19 (s, 1H), 7.94 (m, 1H), 7.89 (m, 1H), 7.46 (m, 4H), 7.34 (s, 1H), 7.33 (d, J=16.0 Hz, 1H), 7.21 (d, J=8.0 Hz, 2H), 6.98 (d, J=16 Hz, 1H), 2.63 (t, 2H), 1.65 (m, 2H), 1.25-1.33 (m, 6H), 0.90 (t, 3H). Anal. calcd. for ($C_{26}H_{26}S$): C, 84.27; H, 7.07. Found: C, 84.27; H, 6.89. m.p. 300-302° C.

Figure 2:
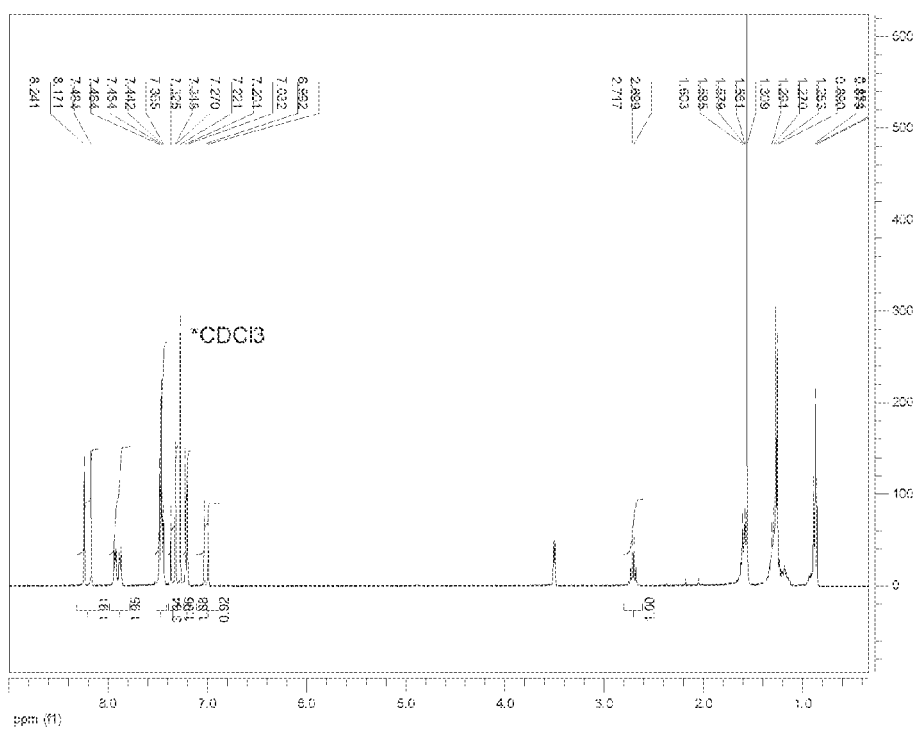
FIG. 2 shows the $^1$H NMR spectrum of a compound according to the present teachings, namely, 2-[2-(4-(1-methylpentyl)phenyl)vinyl]naphtho[2,3-b]thiophene (1MP-PVNT).
Figure 3:
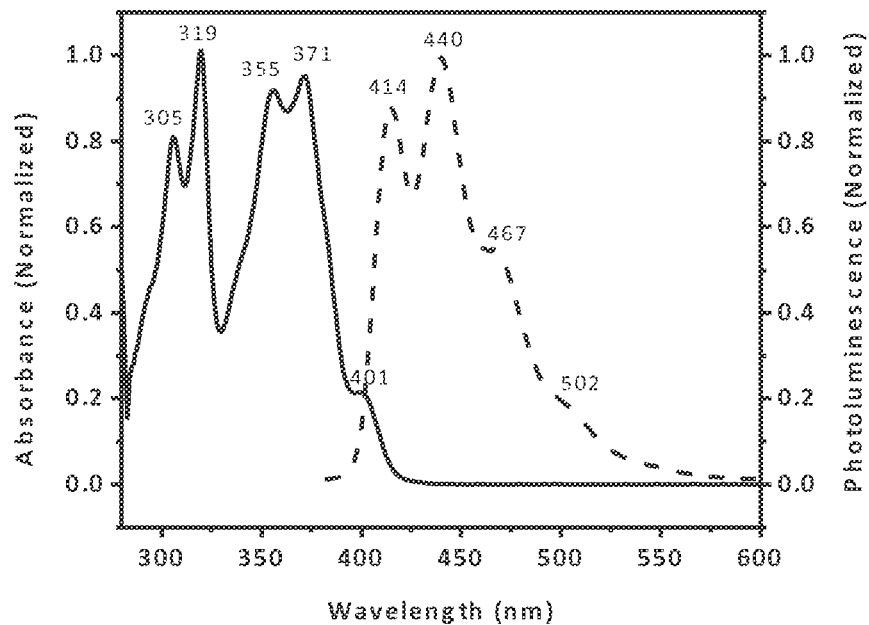
FIG. 3 shows an optical absorption spectrum (solid line) and a photoluminescence spectrum (dashed line, $\lambda_{ex}$=371 nm) of 2-[2-(4-(1-methylpentyl)phenyl)vinyl]naphtho[2,3-b]thiophene (1MP-PVNT) in toluene.
Figure 4:
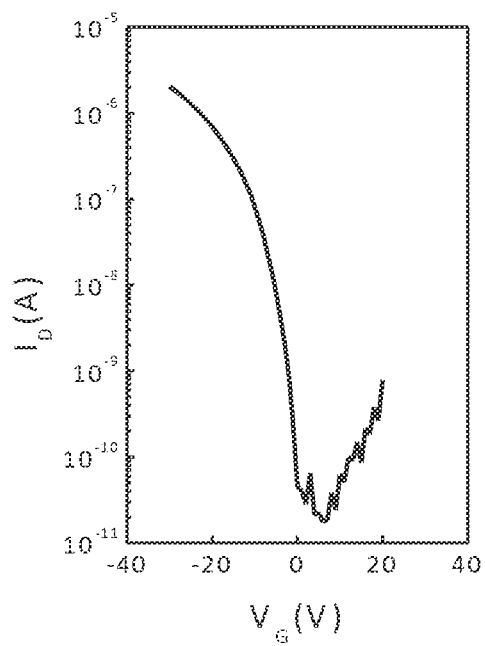
FIG. 4 shows a representative transfer plot of an OTFT (TGBC) device having a semiconductor component composed of 2-[2-(4-(1-methylpentyl)phenyl)vinyl]naphtho[2,3-b]thiophene (1MP-PVNT).

FIG. 2 shows an $^1$H NMR spectrum of 1MP-PVNT. FIG. 3 shows an optical absorption spectrum (solid line) and a photoluminescence spectrum of 1MP-PVNT in toluene.

Example 1b

Synthesis of DF-PVNT

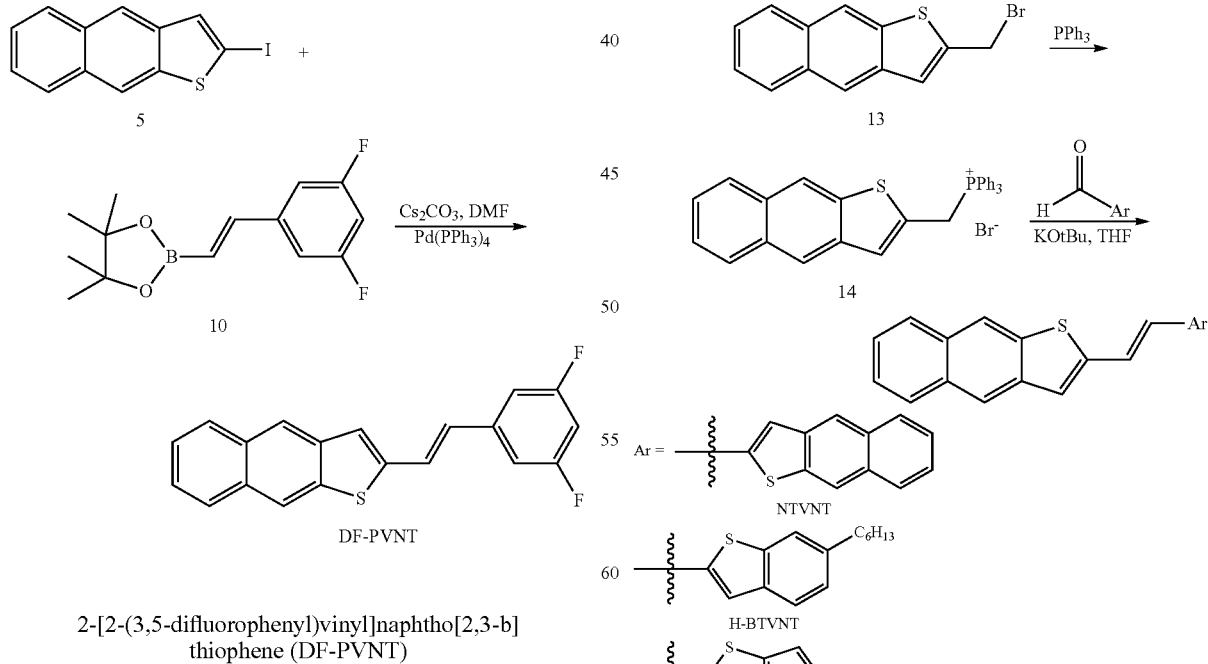

2-[2-(3,5-difluorophenyl)vinyl]naphtho[2,3-b]thiophene (DF-PVNT)

A solution of 4,4,5,5-tetramethyl-2-[(1E)-2-(3,5-difluorophenylethenyl]-1,3,2-dioxaborolane (10, 1.05 g, 3.95 mmol), 2-iodonaphtho[2,3-b]thiophene (5, 665 mg, 2.14 mmol), $Cs_2CO_3$ (4.19 g, 12.9 mmol), and $Pd(PPh_3)_4$ (99 mg, 0.086 mmol, 4% mol) in dry DMF (60 mL) was heated at 80° C. overnight under nitrogen. The reaction mixture was then allowed to cool to room temperature. The resulting precipitate was filtered, then washed with methanol, water, and hexanes to yield an off-white solid (293 mg, 42% yield). $^1$H NMR (500 MHz, $CDCl_3$) δ 8.26 (s, 1H), 8.22 (s, 1H), 7.94 (m, 1H), 7.89 (m, 1H), 7.47 (m, 2H), 7.40 (s, 1H), 7.36 (d, J=16.0 Hz, 1H), 7.06 (m, 1H), 7.04 (d, 1H), 6.88 (d, J=16 Hz, 1H), 6.74 (m, 1H). Anal. calcd. for ($C_{20}H_{12}F_2S$): C, 74.51; H, 3.75. Found: C, 74.56; H, 3.81. m.p. 265-267° C.

Example 1c

Synthesis of NTVNT, H-BTVNT, H-TTVNT, and P-BTVNT

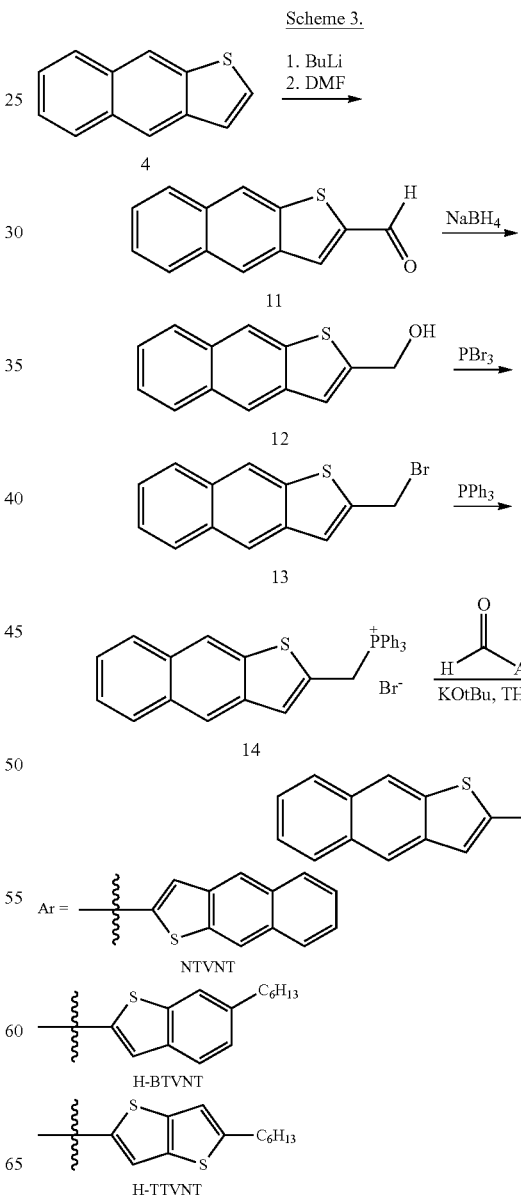

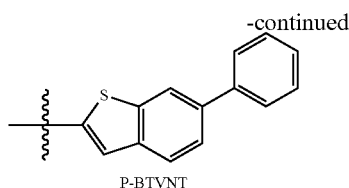

P-BTVNT

Naptho[2,3-b]thiophene-2-carbaldehyde (11)

Naptho[2,3-b]thiophene (4, 4.00 g, 21.7 mmol., 1.00 equiv.) and THF (360 mL) were added to a 500 mL Schlenk flask. The mixture was cooled to −78° C. and n-butyllithium was added (2.5 M in hexanes, 9.6 mL, 24 mmol., 1.1 equiv.). The mixture was stirred at −78° C. for 15 minutes before removing the dry ice/acetone bath and stirring at ambient for 2 hours. The mixture was cooled back to −78° C. and N,N-dimethylformamide (2.0 mL, 26 mmol., 1.2 equiv.) was added. The mixture was left to warm slowly to room temperature while stirring for 16 hours. The solution was diluted with water (500 mL) and diethyl ether (500 mL). The layers were separated and the aqueous layer was extracted with diethyl ether (250 mL). The combined organic layers were washed with brine (300 mL), dried with $MgSO_4$ and concentrated. The crude material was purified by silica gel column chromatography (solid loading, dichloromethane) to give a yellow solid (3.69 g, 80% yield). $^1$H NMR (400 MHz, $CDCl_3$) δ ppm 10.18 (s, 1H), 8.52 (s, 1H), 8.39 (s, 1H), 8.16 (s, 1H), 8.07-7.88 (m, 2H), 7.54 (dddd, J=21.45, 8.05, 6.69, 1.28 Hz, 2H).

Naptho[2,3-b]thiophene-2-methanol (12)

Naptho[2,3-b]thiophene-2-carbaldehyde (11, 2.81 g, 13.2 mmol., 1.00 equiv.,) and ethanol (180 mL) were added to a 300 mL round-bottomed flask. Any clumps of 12 were broken up using a spatula. Sodium borohydride (535 mg, 14.1 mmol., 1.00 equiv.) was carefully added and the reaction stirred vigorously at room temperature for 5 hours. The suspension was poured into water (300 mL). The solids were collected by filtration, washed with water (40 mL) and dried under vacuum at 60° C. to give a beige solid (2.71 g, 96% yield). $^1$H NMR (400 MHz, $CDCl_3$) δ ppm 8.31 (s, 1H), 8.22 (s, 1H), 7.97-7.87 (m, 2H), 7.48-7.44 (m, 2H), 7.31 (d, J=0.8 Hz, 1H), 4.98 (dd, J=6.4, 1.2 Hz, 2H), 1.93 (t, J=6.4 Hz, 1H).

2-(Bromomethyl)-Naptho[2,3-b]thiophene (13)

Naptho[2,3-b]thiophene-2-methanol (12, 2.71 g, 12.6 mmol., 1.00 equiv.) and diethyl ether (76 mL) were added to a 280 mL Schlenk flask and the mixture was cooled to 0° C. Phosphorus tribromide was added (0.89 mL, 9.5 mmol., 0.75 equiv.) and the mixture was left to warm slowly to room temperature while stirring for 16 hours. The mixture was diluted with methanol (300 mL) and the solids were collected by filtration and washed with methanol (50 mL), giving a beige solid (2.98 g, 85% yield). $^1$H NMR (400 MHz, $CDCl_3$) δ ppm 8.27 (s, 1H), 8.23 (s, 1H), 7.97-7.86 (m, 2H), 7.52-7.43 (m, 2H), 7.41 (s, 1H), 4.81 (s, 2H).

2-Naptho[2,3-b]thienylmethyltriphenylphosphonium bromide (14)

2-(bromomethyl)-Naptho[2,3-b]thiophene (13, 2.31 g, 8.33 mmol., 1.00 equiv.), toluene (80 mL) and triphenylphosphine (2.62 g, 10.0 mmol., 1.20 equiv.) were combined in a 200 mL Schlenk flask, which was placed in a 110° C. heat bath. The suspension was stirred for 20 hours before cooling to room temperature, filtering to collect the solid, and washing with toluene (50 mL) to give a white crude solid (4.73 g). $^1$H NMR (500 MHz, $CDCl_3$) δ ppm 8.12 (s, 1H), 8.04 (s, 1H), 7.90-7.75 (m, 11H), 7.67-7.61 (m, 6H), 7.26 (s, 1H), 6.04 (d, J=14.2, 2H).

General Procedure for Wittig Olefination to Afford Diarylethylenes:

2-Naptho[2,3-b]thienylmethyltriphenylphosphonium bromide (14, 0.5-3 mmol., 1.00 equiv.), aryl aldehyde (1.00 equiv.) and THF (0.025 M with respect to 14) were combined in a two-neck round-bottom flask. The suspension was cooled to 0° C. and potassium tert-butoxide (1.50 equiv.) was added portion-wise over 10 minutes. The mixture was left to warm slowly to room temperature while stirring overnight or until complete, and was then diluted with methanol and filtered. The solid was washed with methanol, water, and again with methanol. The crude product was dried under vacuum and subjected twice to gradient sublimation to afford pure diarylethelene.

2-[2-(2-Naphtho[2,3-b]thiophenyl)vinyl]naphtho[2,3-b]thiophene (NTVNT)

The crude solid was purified by vacuum sublimation in high vacuum ($T_{sub}$=340° C.) to give NTVNT as a yellow solid (160 mg, 37% yield). Anal. calcd. for ($C_{26}H_{16}S_2$): C, 79.56; H, 4.11. Found: C, 79.22; H, 3.98. m.p.>400° C.

2-[2-(2-(6-Hexylbenzothiophenyl))vinyl]naphtho[2,3-b]thiophene (H-BTVNT)

The crude solid was purified by vacuum sublimation in high vacuum ($T_{sub}$=320° C.) to give H-BTVNT as a yellow solid (330 mg, 41% yield). Anal. calcd. for ($C_{28}H_{26}S_2$): C, 78.83; H, 6.14. Found: C, 78.86; H, 6.07. m.p.=332-334° C.

2-[2-(2-(5-Hexylthieno[3,2-b]thiophenyl))vinyl]naphtho[2,3-b]thiophene (H-TTVNT)

The crude solid was purified by vacuum sublimation in high vacuum ($T_{sub}$=310° C.) to give H-TTVNT as a yellow solid (150 mg, 23% yield). $^1$H NMR (500 MHz, $CDCl_3$) δ 8.25 (s, 1H), 8.19 (s, 1H), 7.95 (m, 1H), 7.90 (m, 1H), 7.49 (m, 2H), 7.35 (d, J=16.0 Hz, 1H), 7.21 (s, 1H), 7.16 (s, 1H), 7.08 (s, 1H), 6.95 (d, J=16 Hz, 1H), 2.53 (t, 2H), 1.63 (m, 2H), 1.25-1.33 (m, 6H), 0.90 (t, 3H). Anal. calcd. for ($C_{26}H_{24}S_3$): C, 72.18; H, 5.59. Found: C, 72.12; H, 5.42. m.p.=335-337° C.

2-[2-(2-(6-Phenylbenzothiophenyl))vinyl]naphtho[2,3-b]thiophene (P-BTVNT)

The crude solid was purified by vacuum sublimation in high vacuum ($T_{sub}$=300° C.) to give P-BTVNT as a yellow solid (350 mg, 50% yield). Anal. calcd. for ($C_{28}H_{18}S_2$): C, 80.35; H, 4.33. Found: C, 80.32; H, 4.53. m.p.=334-336° C.

Example 1d

Synthesis of B-NVNT, H-TVNT, and PF-PVNT

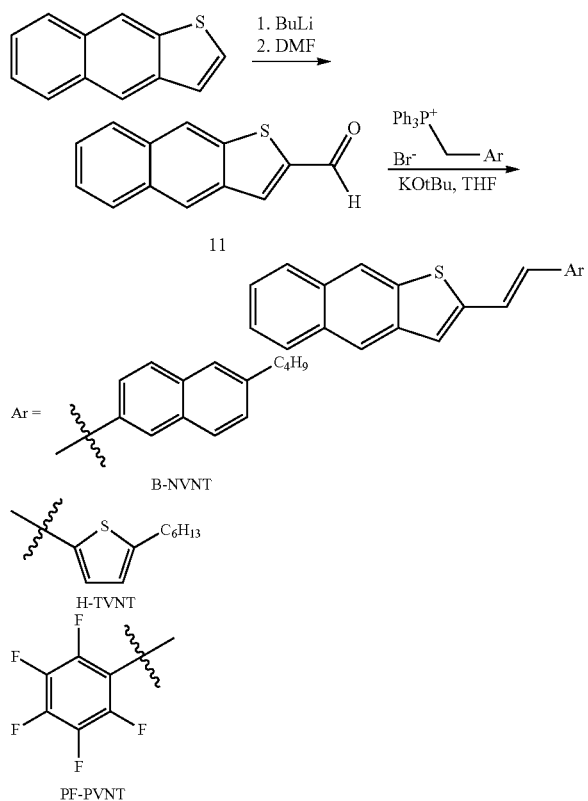

General Procedure for Wittig Olefination to Afford Diarylethylenes:

Naptho[2,3-b]thiophene-2-carbaldehyde (11, 0.5-3 mmol., 1.00 equiv.), arylmethyltriphenylphosphonium bromide (1.00 equiv.), and THF (0.025 M with respect to 11) were combined in a two-neck round-bottom flask. The suspension was cooled to 0° C. and potassium tert-butoxide (1.50 equiv.) was added portion-wise over 10 minutes. The mixture was left to warm slowly to room temperature while stirring overnight or until complete, and was then diluted with methanol and filtered. The solid was washed with methanol, water, and again with methanol. The crude product was dried under vacuum and subjected twice to gradient sublimation to afford pure diarylethelene.

2-[2-(2-(6-Butylnaphthalenyl))vinyl]naphtho[2,3-b]thiophene (B-NVNT)

The crude solid was purified by vacuum sublimation in high vacuum ($T_{sub}$=280° C.) to give B-NVNT as a yellow solid (400 mg, 46% yield). $^1$H NMR (500 MHz, CDCl$_3$) δ 8.27 (s, 1H), 8.20 (s, 1H), 7.93 (m, 1H), 7.88 (m, 2H), 7.79 (m, 2H), 7.73 (d, J=8.5 Hz, 1H), 7.60 (s, 1H), 7.47 (m, 3H), 7.35 (m, 2H), 7.16 (d, J=15.5 Hz, 1H), 2.79 (t, 2H), 1.70 (m, 2H), 1.25 (m, 2H), 0.95 (t, 3H). Anal. calcd. for (C$_{28}$H$_{24}$S): C, 85.67; H, 6.16. Found: C, 85.82; H, 6.17. m.p.=314-316° C.

2-[2-(2-(5-Hexylthiophenyl))vinyl]naphtho[2,3-b]thiophene (H-TVNT)

The crude solid was purified by vacuum sublimation in high vacuum ($T_{sub}$=220° C.) to give H-TVNT as a yellow solid (280 mg, 39% yield). Anal. calcd. for (C$_{28}$H$_{24}$S): C, 76.55; H, 6.42. Found: C, 76.66; H, 6.42. m.p.=237-239° C.

2-[2-(1-(2,3,4,5,6-Pentafluorophenyl))vinyl]naphtho[2,3-b]thiophene (PF-PVNT)

The crude solid was purified by vacuum sublimation in high vacuum ($T_{sub}$=240° C.) to give PF-PVNT as a yellow solid (220 mg, 35% yield). $^1$H NMR (500 MHz, CDCl$_3$) δ 8.28 (s, 1H), 8.25 (s, 1H), 7.95 (m, 1H), 7.89 (m, 1H), 7.70 (d, J=16.0 Hz, 1H), 7.49 (m, 3H), 6.86 (d, J=16.0 Hz, 1H). Anal. calcd. for (C$_{20}$H$_9$F$_5$S): C, 63.83; H, 2.41. Found: C, 63.95; H, 2.45. m.p.=294-296° C.

Example 1e

Synthesis of PVNT

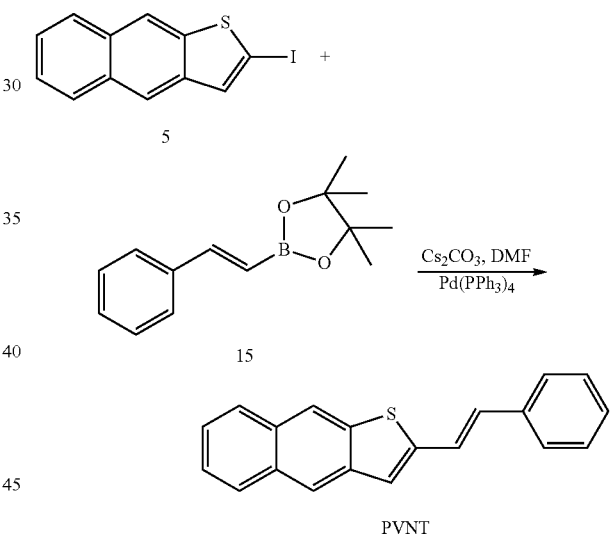

2-[2-(Phenyl)vinyl]naphtho[2,3-b]thiophene (PVNT)

A solution of 4,4,5,5-Tetramethyl-2-[(1E)-2-(phenylethenyl]-1,3,2-dioxaborolane (15, 1.62 g, 7.04 mmol), 2-iodonaphtho[2,3-b]thiophene (5, 1.04 g, 3.35 mmol), Cs$_2$CO$_3$ (6.53 g, 20.04 mmol), and Pd(PPh$_3$)$_4$ (154.5 mg, 0.134 mmol, 4% mol) in dry DMF (70 mL) was heated at 80° C. for overnight for 2 days. The reaction mixture was then allowed to cool to room temperature, the formed precipitate was filtered and washed with methanol, water, and hexanes to yield a green crude solid. The crude solid was purified by vacuum sublimation in high vacuum ($T_{sub}$=250° C.) to give PVNT as an off-white solid (480 mg, 50% yield). $^1$H NMR (500 MHz, C$_2$D$_2$Cl$_4$) δ 8.24 (s, 1H), 8.15 (s, 1H), 7.96 (m, 1H), 7.89 (m, 1H), 7.45 (m, 5H), 7.34 (s, 1H), 7.32 (d, J=16.0 Hz, 1H), 7.21 (d, J=8.0 Hz, 2H), 6.98 (d, J=16 Hz, 1H). Anal. calcd. for (C$_{20}$H$_{14}$S): C, 83.88; H, 4.93. Found: C, 84.37; H, 4.74. m.p. 305-307° C.

Example 2

Device Fabrication

Device Fabrication Procedure (Top-Gate Bottom-Contact (TGBC) Transistors):

For TGBC devices, polyethylenenaphthalate (PEN) substrates (2"×2") were planarized with UV-curable polymeric films (ActivInk D1400, Polyera Corp., Skokie, Ill.). A silver layer of 50 nm was then deposited by thermal evaporation. Source and drain contacts were patterned using photolithography process and the silver film was etched by a mixture of acids and water. The semiconductor was spun from a hydrocarbon solution (4 mg-mL) at 2000 rpm. The thickness of the semiconductor film can depend on the solubility of the semiconductor. In the case of 1MP-PVNT, the film had a thickness of about 60 nm. These films were then baked on a hot plate at about 110° C. for about 10 min to remove residual solvent. The amorphous fluoropolymer CYTOP (CTL-809M, Asahi Glass Corporation) was spun as the top-gate dielectric at 5000 rpm to a thickness of about 450 nm, and baked on a hot plate at about 100° C. for 10 minutes. The device structure was completed by the evaporation of an aligned Ag top-gate stripe.

Table 1 below summarizes the performance of the devices.

TABLE 1

Summary of average hole mobility ($\mu_{mean}$), on/off ratio ($I_{ON}/I_{OFF}$), and threshold voltage ($V_T$) for representative top-gate OTFT devices.

| Compound | Device Architecture | Semiconductor Deposition Method[a] | Channel Length (μm)[b] | $\mu_{mean}$ (cm$^2$/V·s) | $V_T$ (V) | $I_{ON}/I_{OFF}$ |
|---|---|---|---|---|---|---|
| 1MP-PVNT | TGBC | SC | 10[b] | 0.05 | ~−6 | ~10$^5$ |
| H-PVNT | TGBC | SC | 20[b] | 0.025 | ~−15 | ~10$^5$ |

[a]SC means spin-coating from a solution of the compound that was maintained at or near room temperature (<40° C.).
[b]Electrical contacts are Ag.

Device Fabrication Procedure (Bottom-Gate Top-Contact (BGTC) transistors):

Highly doped n-type (100) silicon wafers (<0.004 Ωcm) were used as gate electrodes as well as substrates, and 300 nm SiO$_2$ thermally grown on Si was used as the gate insulator. The unit area capacitance is 11 nF/cm$^2$. The substrate surface was treated with hexamethyldisilazane (HMDS) purchased from Aldrich. A few drops of HMDS were loaded inside a self-assembly chamber under an N$_2$ blanket. The SiO$_2$/Si substrates were exposed to this atmosphere for at least ~2 days to give a hydrophobic surface. After HMDS deposition, the advancing aqueous contact angle is ~100°. Semiconductor thin films (40-50 nm) were next vapor-deposited onto the HMDS-Si/SiO$_2$ substrates held at preselected temperatures of 70° C. with a deposition rate of 0.1-0.2 Å/s at 6×10$^{-6}$ Torr, employing a high-vacuum deposition chamber (Denton Vacuum, Inc., USA). Gold source and drain electrodes (50 nm) were vapor-deposited at 2×10$^{-6}$ Torr through a shadow mask in the vacuum deposition chamber. Devices were fabricated with typical channel lengths of 100 μm, and a channel width of 1000 μm.

Table 2 below summarizes the performance of the devices.

TABLE 2

Summary of average hole mobility ($\mu_{mean}$), on/off ratio ($I_{ON}/I_{OFF}$), and threshold voltage ($V_T$) for representative bottom-gate OTFT devices.

| Compound | Device Architecture | Semiconductor Deposition Method[a] | Channel Length (μm)[b] | $\mu_{mean}$ (cm$^2$/V·s) | $V_T$ (V) | $I_{ON}/I_{OFF}$ |
|---|---|---|---|---|---|---|
| NTVNT | BGTC | PVD | 100 | 0.20 | −35 | ~10$^5$ |
| H-BTVNT | BGTC | PVD | 100 | 0.10 | −18 | ~10$^5$ |
| H-TTVNT | BGTC | PVD | 100 | 0.03 | −20 | ~10$^5$ |
| P-BTVNT | BGTC | PVD | 100 | 0.06 | −32 | ~10$^5$ |
| B-NVNT | BGTC | PVD | 100 | 0.05 | −14 | ~10$^5$ |
| H-TVNT | BGTC | PVD | 100 | 0.06 | −20 | ~10$^5$ |
| PF-PVNT | BGTC | PVD | 100 | NA | NA | NA |
| PVNT | BGTC | PVD | 100 | 0.02 | −23 | ~10$^5$ |

[a]PVD means physical vapor deposition.
[b]Electrical contacts are Au.

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A compound represented by formula I:

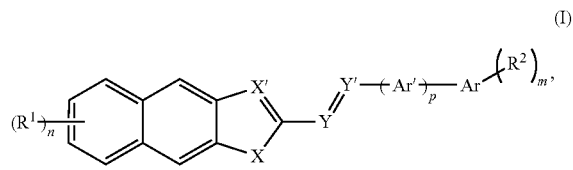

(I)

wherein:
Ar is an optionally substituted $C_{6-20}$ aryl group or an optionally substituted 5-20 membered heteroaryl group;
Ar' is an optionally substituted $C_{6-20}$ aryl group or an optionally substituted 5-20 membered heteroaryl group;
$R^1$ and $R^2$, at each occurrence, independently are selected from the group consisting of a halogen, —CN, and -L-R, wherein L, at each occurrence, is selected from —O—, —S—, —Se—, —C(O)—, —OC(O)—, —C(O)O—, and a covalent bond; and R, at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group;
X is selected from the group consisting of —O—, —S—, and —Se—;
X' is —CR$^3$, wherein R$^3$ is selected from the group consisting of H, a halogen, —CN, and -L'-R', wherein L' is selected from the group consisting of —O—, —S—, —Se—, —C(O)—, —OC(O)—, —C(O)O—, and a covalent bond; and R' is selected from the group consisting of a $C_{1-40}$ alkyl group, a $C_{2-40}$ alkenyl group, a $C_{2-40}$ alkynyl group, and a $C_{1-40}$ haloalkyl group;
Y and Y', independently, are CH or N;

m is 0, 1, 2, 3, 4 or 5;

n is 0, 1, 2, 3 or 4; and p is 0 or 1.

2. The compound of claim 1, wherein X is S or Se.

3. The compound of claim 1, wherein the compound is represented by formula II:

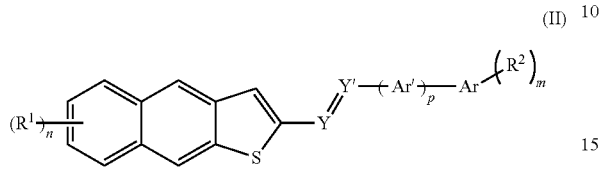

(II)

wherein Ar, Ar', R¹, R², Y, Y', m, n and p are as defined in claim 1.

4. The compound of claim 1, wherein the compound is represented by formula III:

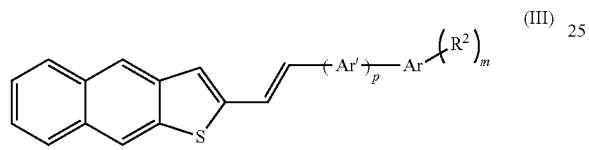

(III)

wherein Ar, Ar', R², m and p are as defined in claim 1.

5. The compound of claim 1, wherein the compound is represented by formula IV:

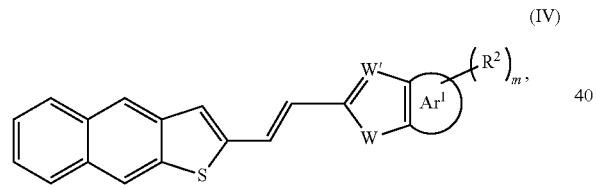

(IV)

wherein:

Ar¹ is an optionally substituted $C_{6-14}$ aryl group or an optionally substituted 5-14 membered heteroaryl group;

W is selected from the group consisting of —CR³=CR³—, —O—, —S—, and —Se—;

W' is —CR³= or —N=; and

R², R³, and m are as defined in claim 1.

6. The compound of claim 5, wherein the compound is represented by formula V:

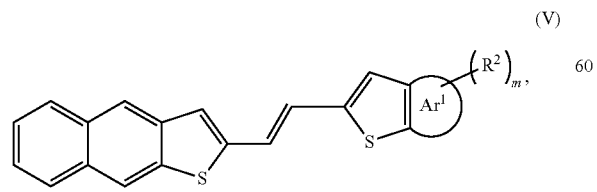

(V)

wherein Ar¹, R², and m are as defined in claim 5.

7. The compound of claim 6, wherein the moiety

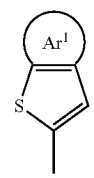

is selected from the group consisting of:

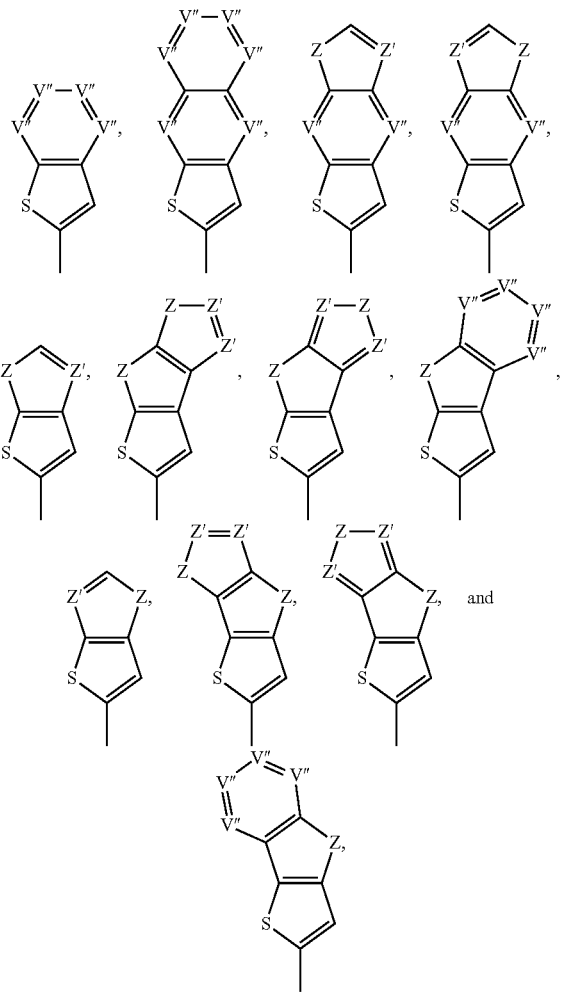

wherein:

V", at each occurrence, independently is —CR⁴= or —N=;

Z, at each occurrence, independently is selected from the group consisting of —O—, —S—, and —Se—;

Z', at each occurrence, independently is —CR⁴= or —N=; and

R⁴, at each occurrence, independently is selected from the group consisting of H, a halogen, —CN, and L'R', wherein L', at each occurrence, is selected from the group consisting of —O—, —S—, —Se—, —C(O)—, —OC(O)—, —C(O)O—, and a covalent bond; and R', at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group.

8. The compound of claim 7, wherein the moiety

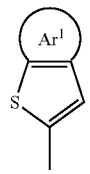

is selected from the group consisting of:

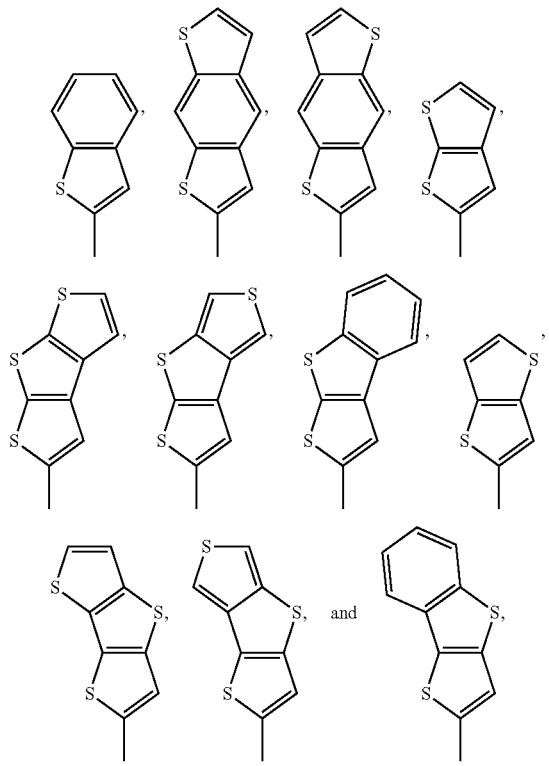

wherein any of the carbon atoms optionally is substituted with a halogen, —CN, or -L'-R', wherein L', at each occurrence, is selected from the group consisting of —O—, —S—, —Se—, —C(O)—, —OC(O)—, —C(O)O—, and a covalent bond; and R', at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group.

9. The compound of claim 1, wherein the compound has a formula selected from the group consisting of:

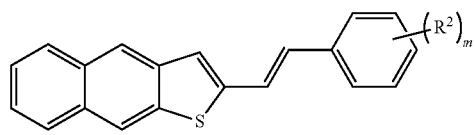

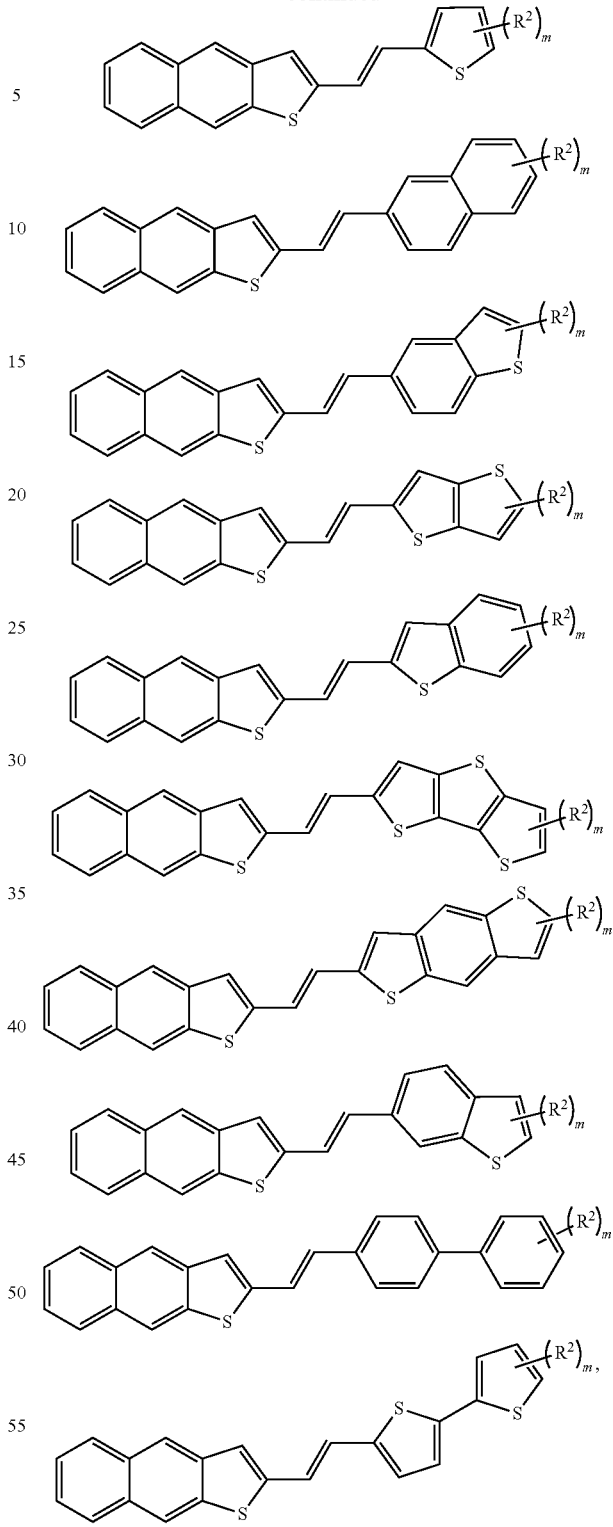

wherein $R^2$ and m are as defined in claim 1.

10. The compound of claim 9, wherein $R^2$ is a $C_{1-40}$ alkyl group or a $C_{1-40}$ haloalkyl group; and m is 0, 1 or 2.

11. An electronic, optical or optoelectronic device comprising a semiconductor component, the semiconductor component comprising a compound according to claim 1.

12. The device of claim 11, wherein the semiconductor component is photoactive, and wherein the compound of claim 1 functions as an electron-conducting compound and is present in a blend material.

13. The device of claim 11, wherein the semiconductor component is photoactive, and wherein the compound of claim 1 functions as a hole-conducting compound and is present in a blend material.

14. The device of claim 11, wherein the semiconductor component is photoactive, and wherein the compound of claim 1 functions as an light-emitting compound and is present in a blend material.

15. The device of claim 11 configured as an organic light emitting diode comprising a substrate, an anode, a cathode, and in between the anode and the cathode the semiconductor component.

16. The device of claim 11 configured as an organic transistor, further comprising a source electrode, a drain electrode, a gate electrode, and a dielectric layer, wherein the dielectric layer is in contact with the semiconductor component on one surface, and the gate electrode on an opposite surface.

17. The device of claim 16, wherein the organic transistor is an organic field-effect transistor.

18. The device of claim 16, wherein the organic transistor is an organic light-emitting transistor.

19. The device of claim 18, wherein the semiconductor component is photoactive, and wherein the compound of claim 1 functions as an electron-conducting compound or a hole-conducting compound and is present in a blend material.

20. The device of claim 18, wherein the semiconductor component is photoactive, and wherein the compound of claim 1 functions as an light-emitting compound and is present in a blend material.

* * * * *